(12) United States Patent
Feldman

(10) Patent No.: US 6,782,249 B1
(45) Date of Patent: Aug. 24, 2004

(54) QUADRATURE SIGNAL GENERATION IN AN INTEGRATED DIRECT CONVERSION RADIO RECEIVER

(75) Inventor: Arnold R. Feldman, San Francisco, CA (US)

(73) Assignee: Intel Corporation, Santa Clara, CA (US)

(*) Notice: Subject to any disclaimer, the term of this patent is extended or adjusted under 35 U.S.C. 154(b) by 485 days.

(21) Appl. No.: 09/721,374

(22) Filed: Nov. 22, 2000

(51) Int. Cl.[7] .................................................. H04B 1/26
(52) U.S. Cl. .................... 455/323; 455/76; 455/317; 455/324; 331/12
(58) Field of Search .................... 455/323, 76, 313, 455/324, 317, 318, 319; 331/12

(56) References Cited

U.S. PATENT DOCUMENTS

| | | | | |
|---|---|---|---|---|
| 4,246,539 A | * | 1/1981 | Haruki et al. ............... 455/76 |
| 5,822,366 A | * | 10/1998 | Rapeli ........................ 331/12 |
| 5,896,562 A | * | 4/1999 | Heinonen ................... 455/76 |
| 5,953,643 A | * | 9/1999 | Speake et al. ............. 455/324 |
| 6,016,422 A | * | 1/2000 | Bartusiak ................... 455/324 |

* cited by examiner

Primary Examiner—Edward F. Urban
Assistant Examiner—Lana Le
(74) Attorney, Agent, or Firm—Seth Z. Kalson

(57) ABSTRACT

A receiver for direct conversion of RF signals, a particular embodiment comprising a quadrature signal generation circuit having an oscillator with an oscillation frequency of $\frac{2}{3}$ times that of the carrier frequency of the RF signal. For the particular embodiment, the quadrature generation circuit includes a divide-by-two division circuit to provide quadrature signals having a frequency of $\frac{1}{3}$ that of the carrier frequency, and further including mixers and filters to mix the output of the oscillator and the output of the divide-by-two division circuit so as to provide quadrature signals at the carrier frequency.

17 Claims, 4 Drawing Sheets

QUADRATURE SIGNAL GENERATION IN AN INTEGRATED DIRECT CONVERSION RADIO RECEIVER

FIELD

Disclosed embodiments of the present invention relate to circuits, and more particularly, to radio frequency communication circuits.

BACKGROUND

In a direct conversion radio receiver or transceiver, an RF (Radio Frequency) signal is directly down-converted to a baseband signal without first down-converting to an IF (Intermediate Frequency) signal. For many types of receivers, both the inphase and quadrature components of the baseband signal are employed for further demodulation or detection. A simplified functional diagram of a transceiver employing direct conversion is illustrated in FIG. 1.

In FIG. 1, antenna 102 receives an RF signal. When the transceiver is in its receive mode, the received RF signal is filtered by bandpass filter 104 and mixed with quadrature RF local oscillator signals $\cos(\omega_c t)$ and $\sin(\omega_c t)$ by mixers 106 and 108, respectively, where $\omega_c$ is the carrier frequency in radians/sec. The output signals of mixers 106 and 108 are filtered by low pass filters 110 and 112, respectively, to provide the inphase (I) and quadrature (Q) components. Detector 114 further processes the I and Q components to provide the final digital data to the end user. Detector 114 may employ matched filtering, error detection and correction, spread-spectrum filtering (de-spreading), and other forms of detection appropriate for the particular modulation and coding scheme that is employed. When the transceiver is in its transmit mode, digital data provided by the end user is encoded by encoder 116, modulated to a baseband signal by modulator 118, up-converted via mixer 120 by mixing with $\cos(\omega_c t)$ and band pass filtered by filter 122. The quadrature RF local oscillator signals $\cos(\omega_c t)$ and $\sin(\omega_c t)$ may be obtained from VCO (Voltage Controlled Oscillator) 126 within PLL (Phase Lock Loop) 124.

If the oscillation frequency of PLL 124 is substantially the same as the carrier frequency, $\omega_c$, then VCO 126 may be susceptible to "frequency pulling" during transmission of an RF signal. This may be caused by VCO 126 locking on to the frequency of the transmitted RF signal during transmission because of unintended feedback. If FSK (Frequency Shift Key) modulation is employed, then the transmitted RF signal has a varying instantaneous frequency, possibly centered around $\omega_c$. VCO 126 cannot instantly return back to the carrier frequency $\omega_c$ when the transceiver enters its receive mode, in which case a received RF signal may not be accurately mixed down to its baseband I and Q components.

VCO 126 is less susceptible to frequency pulling if its oscillation frequency is substantially different from $\omega_c$. Thus, one approach to mitigating frequency pulling of VCO 126 is to run VCO 126 at twice the carrier frequency, and then synthesize the quadrature mixing signals by a divide-by-two division circuit. This is illustrated in FIG. 2, where VCO 202 oscillates at $2\omega_c$ and JK flip flop 204 is configured as a divide-by-two division circuit. One of the quadrature mixing components is taken from output port 206 of JK flip flop 204. The other quadrature mixing component is taken at output port 208 of XOR (exclusive-OR) gate 210.

The quadrature mixing signals in FIG. 2 are square waves, whereas in FIG. 1 the quadrature mixing signals are represented by analog sinusoids, e.g., $\cos(\omega_c t)$ and $\sin(\omega_c t)$. It is to be understood that FIG. 1 is a representation of a communication circuit at a functional level, and that for particular implementations, the quadrature mixing signals may be square waves of frequency $\omega_c$ rather than analog sinusoids of frequency $\omega_c$. It is to be understood throughout these letters patent that sinusoids may be interpreted as square waves, or other discrete-valued periodic waveforms.

As carrier frequencies are increased for communication circuits, running a VCO at twice the carrier frequency may add unwanted cost. For example, in a communication circuit for the consumer market, such as a transceiver circuit in a cordless phone, the carrier frequency may be on the order of 2.5 GHz, so that running a VCO at 5 GHz may add to its manufacturing cost.

DESCRIPTION OF THE EMBODIMENTS

Figure 3:
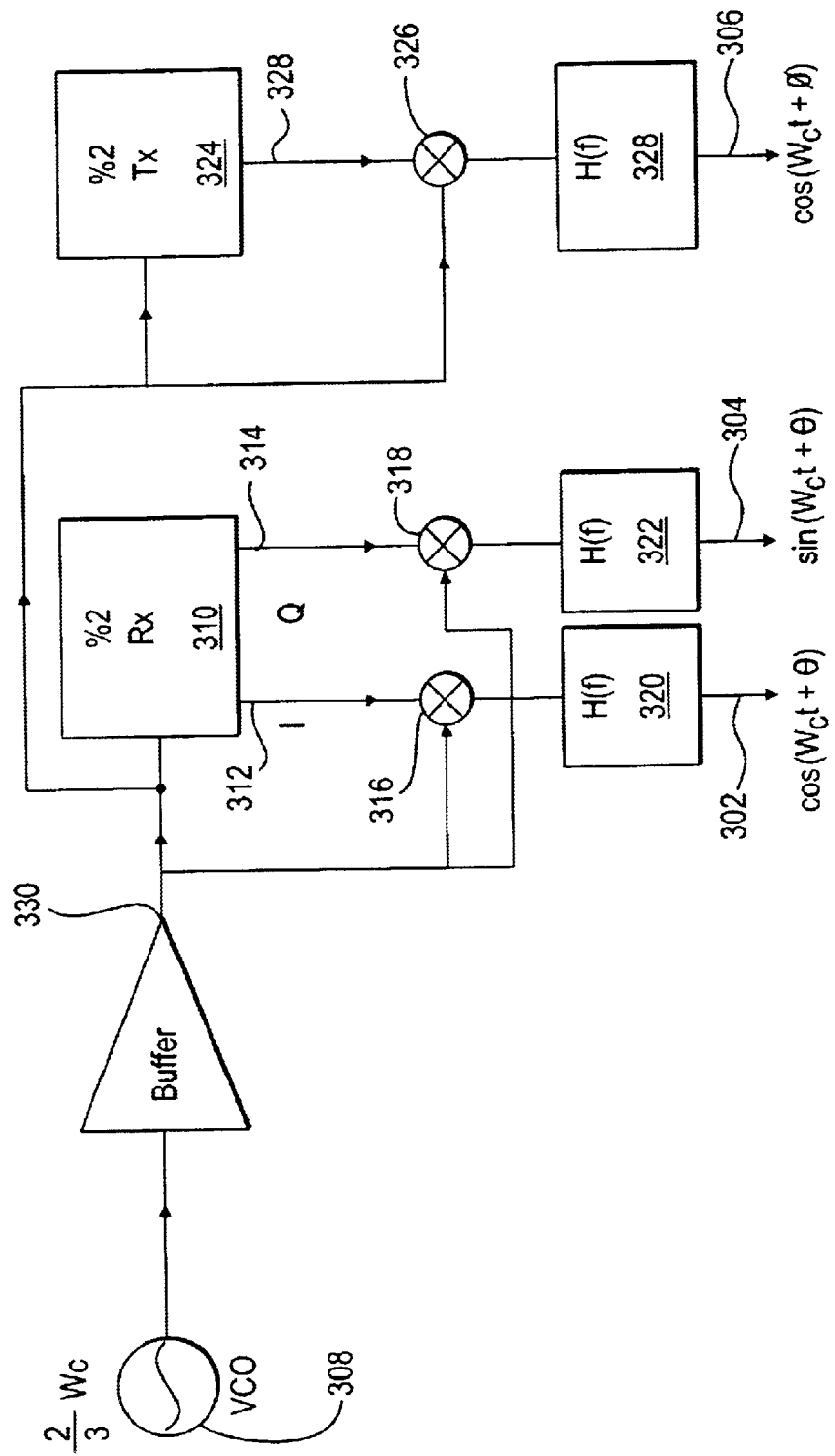
FIG. 3 is a high-level functional diagram of a quadrature generator circuit according to an embodiment of the present invention.

FIG. 3 provides a high-level functional diagram of a circuit for generating quadrature mixing signals according to an embodiment of the present invention. The quadrature mixing signals, denoted as $\cos(\omega_c t + \partial)$ and $\sin(\omega_c t + \partial)$, are provided at ports 302 and 304, respectively, where $\partial$ denotes some arbitrary phase. Another sinusoid, denoted as $\cos(\omega_c t + \omega)$, is provided at port 306, where $\omega$ denotes some arbitrary phase. For simplicity, the amplitudes of the sinusoids are taken as unity, but are not limited as such. Quadrature signals $\cos(\omega_c t + \partial)$ and $\sin(\omega_c t + \partial)$ are available for direct conversion of received RF signals, and the sinusoid $\cos(\omega_c at + \partial)$ is available for up-converting modulated signals to the carrier frequency $\omega_c$ for subsequent transmission.

VCO 308 provides an output signal with oscillation frequency $(\tfrac{2}{3})\omega_c$. Divide-by-two division circuit 310 provides quadrature signals at ports 312 and 314 of frequency $(\tfrac{1}{3})\omega_c$, which are mixed by mixers 316 and 318 with a sinusoid having the same frequency as VCO 308, $(\tfrac{2}{3})\omega_c$. The lower frequency components of the resulting mixed output are filtered out by filters 320 and 322, so that the frequency of the output signals of filters 320 and 322 is given by the sum of the input frequencies to mixers 316 and 318, $\omega_c = (\tfrac{2}{3})\omega_c + (\tfrac{1}{3})\omega_c$. In similar fashion, divide-by-two division circuit 324, mixer 326, and filter 328 provide the sinusoid $\cos(\omega_c t + \omega)$ at port 306.

An advantage of the embodiment illustrated in FIG. 3 is that VCO 308 need not provide an output sinusoid having a frequency greater than the carrier frequency, and yet frequency pulling is reduced because the output frequency of VCO 308 is substantially different from the carrier frequency. In the particular embodiment shown in FIG. 3, the output sinusoid of VCO 308 is at $(\tfrac{2}{3})\omega_c$, but other embodiments may be realized in which divide-by-two division circuits 310 and 324 are replaced with divide-by-N division circuits and VCO 308 is configured to provide an output sinusoid of frequency $[N/(N+1)]\omega_c$. N may be an integer or ratio of integers. However, as N increases, $[N/(N+1)]\omega_c$ approaches $\omega_c$, and frequency pulling may be a problem if N is too large.

Specific implementations of the high-level functional diagram of FIG. 3 may be realized using circuits for single-ended signals or circuits for differential signals. For differential signal circuits, output ports 312, 314, and 328 each provide a differential signal comprising two signals at frequency $(\frac{1}{3})\omega_c$, one signal having an amplitude below a common-mode voltage and one signal having an amplitude above the common-mode voltage. Port 330 also provides a differential signal at frequency $(\frac{2}{3})\omega_c$. These differential signals are then provided to a mixer. One embodiment for a combination of mixer and filter for differential signals is provided in FIG. 4.

Figure 4:
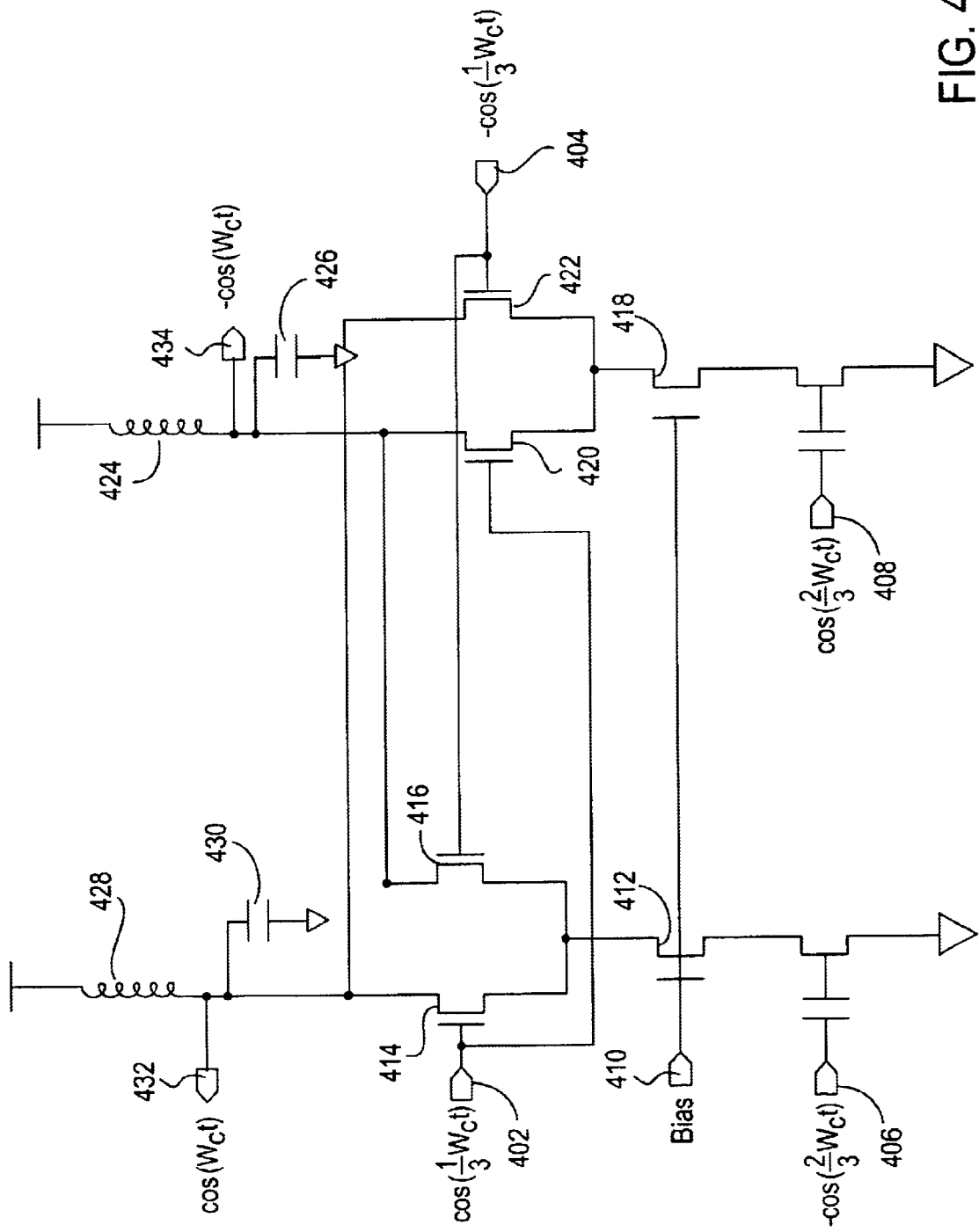
FIG. 4 is an embodiment of a differential signal mixer and filter used in the embodiment of FIG. 3.

In FIG. 4, differential signal notation is employed, where a differential signal x(t) means that the actual voltage is x(t) above a common-mode voltage. A differential signal at frequency $(\frac{1}{3})\omega_c$ is applied to input ports 402 and 404, and a differential signal at frequency $(\frac{2}{3})\omega_c$ is applied to input ports 406 and 408. A bias voltage is applied to input port 410 so that nMOSFET 412 sinks current from the pair of nMOSFETs 414 and 416, and nMOSFET 418 sinks current from the pair of nMOSFETs 420 and 422. Inductor 424 and capacitor 426 provide a reactive load to the pair of nMOSFETs 414 and 416, and inductor 428 and capacitor 430 provide a reactive load to the pair of nMOSFETs 420 and 422. Inductor 428 and capacitor 430, and inductor 424 and capacitor 426, are each resonant circuits with a resonant frequency of $\omega_c$. The output differential signal is provided at output ports 432 and 434.

Figure 1:
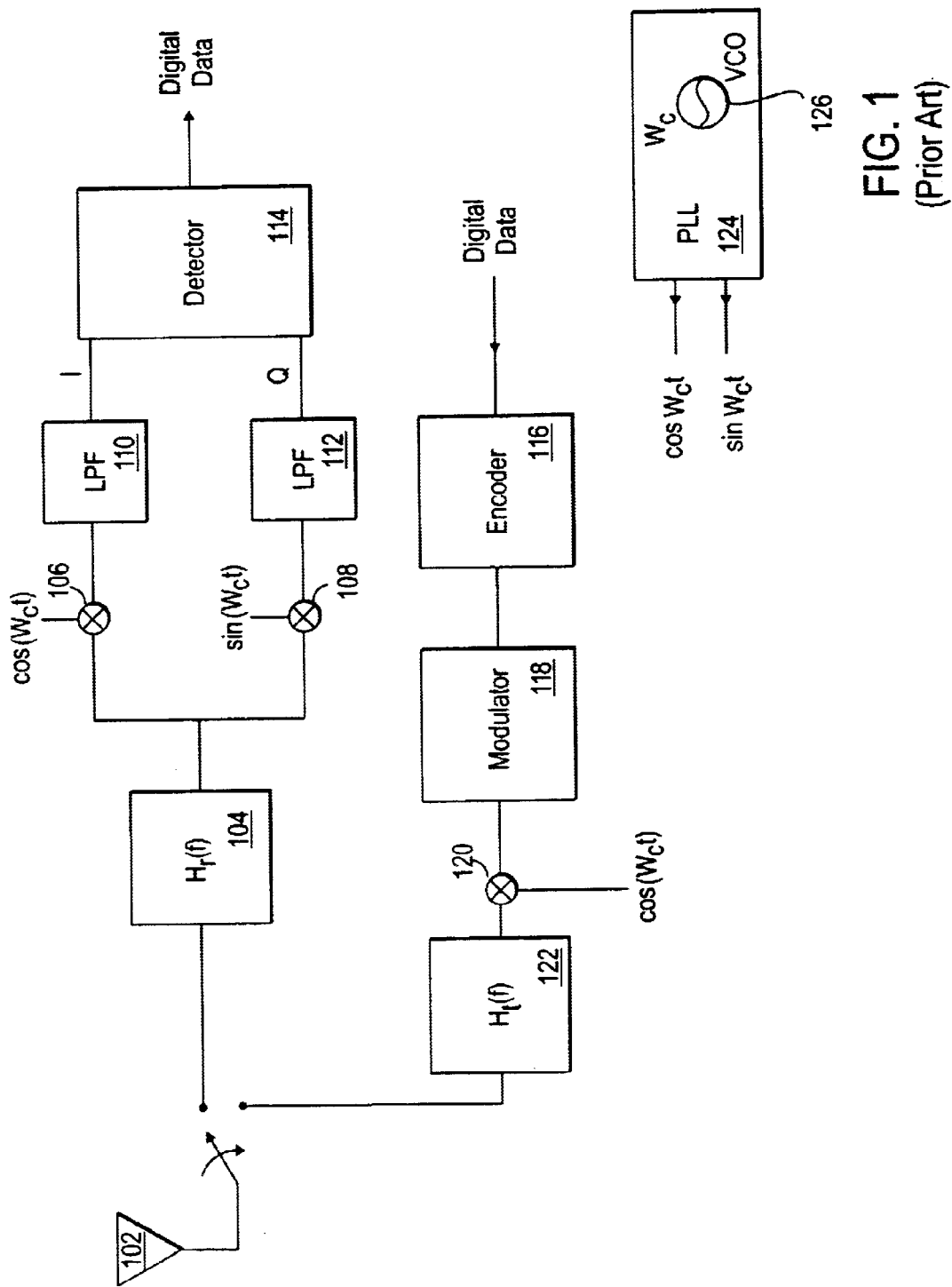
FIG. 1 is a prior art high-level functional diagram of a transceiver.
Figure 2:
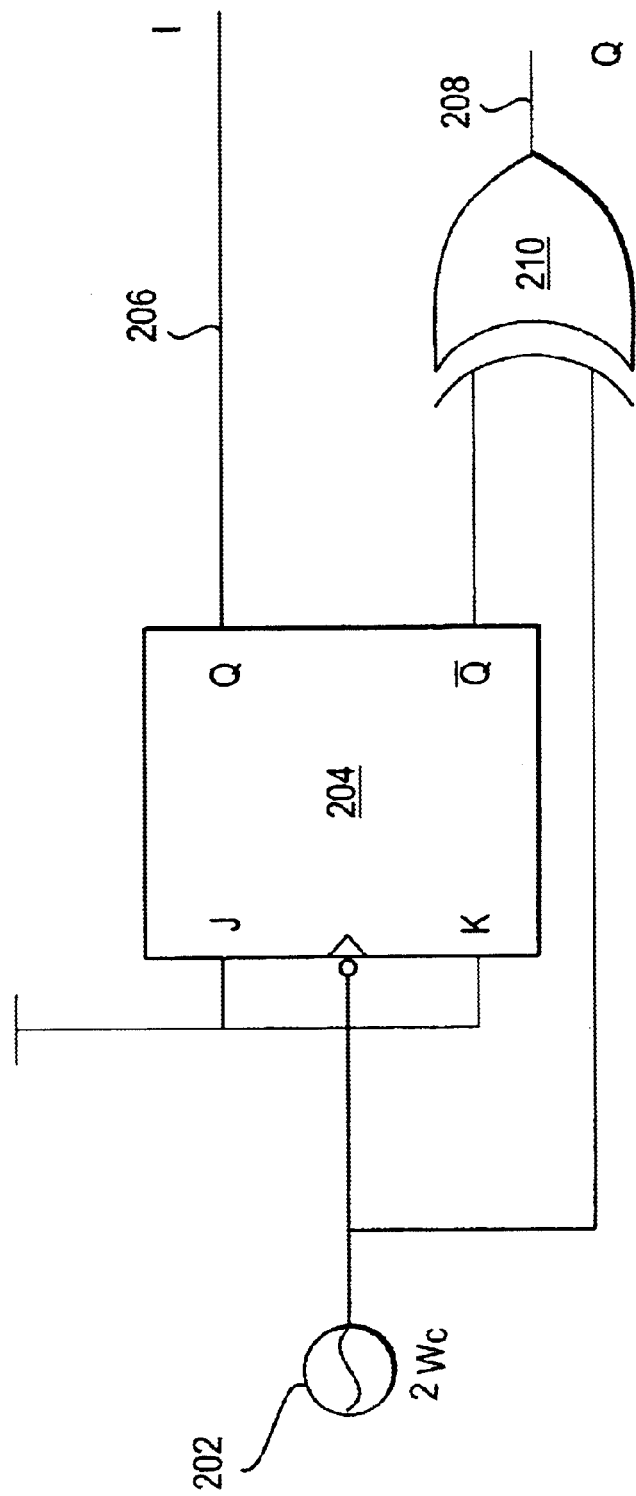
FIG. 2 is a prior art divide-by-two division circuit and XOR gate for generating quadrature signals.

One of ordinary skill in the art will realize that various portions of the embodiment of FIG. 3 may be realized by various combinations of circuits for single-ended signals and differential signals. Similarly, once the quadrature mixing signals, whether differential or single-ended, are synthesized according to the embodiment of FIG. 3, various implementations of the transceiver of FIG. 1 may be realized with various combinations of circuits for single-ended signals and differential signals. Consequently, it is to be understood in the claims that a signal may be either a single-ended signal or a differential signal.

Various modifications may be made to the disclosed embodiments without departing from the scope of the invention as claimed below.

I claim:

1. A circuit comprising:
   a phase lock loop having a frequency;
   an oscillator to provide a first signal having a first frequency substantially equal to N/(N+1) times that of the phase lock loop frequency;
   a divide-by-N division circuit to provide a second signal having a second frequency substantially equal to (1/N) times that of the first frequency; and
   a mixer and filter circuit responsive to the first and second signals to provide a third signal having a frequency substantially equal to the sum of the first and second frequencies.

2. The circuit as set forth in claim 1, wherein the divide-by-N division circuit comprises a divide-by-two division circuit.

3. The circuit as set forth in claim 1, wherein the divide-by-N division circuit is to provide a fourth signal so that the second and fourth signals are quadrature pairs.

4. The circuit as set forth in claim 3, wherein the divide-by-N division circuit comprises a divide-by-two division circuit.

5. The circuit as set forth in claim 3, wherein the mixer and filter circuit is to provide a fifth signal so that the third and fifth signal are quadrature pairs.

6. The circuit as set forth in claim 5, wherein the divide-by-N division circuit comprises a divide-by-two division circuit.

7. A receiver comprising:
   a phase lock loop having a frequency;
   an oscillator to provide a first signal having a first frequency substantially equal to N/(N+1) times that of the phase lock loop frequency;
   a divide-by-N division circuit clocked by the oscillator so as to provide a second signal having a second frequency; and
   a mixer and filter circuit coupled to the oscillator and the divide-by-N division circuit to mix the first and second signals and to substantially filter out the lower frequency components to provide a third signal.

8. The receiver as set forth in claim 7, wherein the divide-by-N division circuit comprises a divide-by-two division circuit.

9. The receiver as set forth in claim 7, wherein the divide-by-N division circuit is to provide a fourth signal, so that second and fourth signals are quadrature pairs.

10. The receiver as set forth in claim 9, wherein the mixer and filter circuit is to provide a fifth signal, so that the third and fifth signals are quadrature pairs.

11. The receiver as set forth in claim 10, wherein the divide-by-N division circuit comprises a divide-by-two division circuit.

12. The receiver as set forth in claim 10, wherein the receiver has mixing circuits to mix a received signal with the third and fifth signals to down convert the received signal to inphase and quadrature baseband components.

13. The receiver as set forth in claim 12, wherein the divide-by-N division circuit comprises a divide-by-two division circuit.

14. A receiver to receive a signal having a carrier frequency, the receiver comprising:
   an oscillator to provide a first signal having a frequency substantially equal to N/(N+1) times that of the carrier frequency;
   a divide-by-N division circuit coupled to the oscillator to provide second and third signals having a frequency substantially equal to I (N+1) times that of the carrier frequency, wherein the second and third signals are quadrature pairs; and
   a mixer and filter circuit coupled to the oscillator and the divide-by-N division circuit to provide fourth and fifth signals having a frequency substantially equal to the carrier frequency, wherein the fourth and fifth signals are quadrature pair.

15. The receiver as set forth in claim 14, wherein the divide-by-N division circuit is a divide-by-two division circuit.

16. The receiver as set forth in claim 14, wherein the received signal is mixed with the fourth and fifth signals to provide inphase and quadrature baseband components.

17. The receiver as set forth in claim 16, wherein the divide-by-N division circuit is a divide-by-two division circuit.

* * * * *

UNITED STATES PATENT AND TRADEMARK OFFICE
CERTIFICATE OF CORRECTION

PATENT NO. : 6,782,249 B1
DATED : August 24, 2004
INVENTOR(S) : Feldman

It is certified that error appears in the above-identified patent and that said Letters Patent is hereby corrected as shown below:

Column 2,
Line 32, delete "$\cos(\omega_x t+\partial)$" and insert -- $\cos(\omega_x t+\theta)$ --.

Line 32, delete "$\sin(\omega_c t+\partial)$" and insert -- $\sin(\omega_c t+\theta)$ --.

Line 33, delete "$\partial$" and insert -- $\theta$ --.

Line 35, delete the first occurrence of "$\omega$" and insert -- $\emptyset$ --.
Line 35, delete the second occurrence of "$\omega$" and insert -- $\emptyset$ --.
Line 38, delete "$\cos(\omega_c t+\partial)$" and insert -- $\cos(\omega_x t+\theta)$ --.

Line 38, delete "$\sin(\omega_c t+\partial)$" and insert -- $\cos(\omega_c t+\theta)$ --.

Line 40, delete "$(\omega_c at+\partial)$" and insert -- $(\omega_c t+\emptyset)$ --.

Line 53, delete "$\cos(\omega_c t+\omega)$" and insert -- $\cos(\omega_c t+\emptyset)$ --.

Column 4,
Line 54, delete "pair" and insert -- pairs --.

Signed and Sealed this

Sixteenth Day of August, 2005

JON W. DUDAS
*Director of the United States Patent and Trademark Office*